US012255648B2

(12) United States Patent
Srinivasan et al.

(10) Patent No.: US 12,255,648 B2
(45) Date of Patent: Mar. 18, 2025

(54) CIRCUIT SYSTEMS AND METHODS FOR REDUCING POWER SUPPLY VOLTAGE DROOP

(71) Applicant: Intel Corporation, Santa Clara, CA (US)

(72) Inventors: Archanna Srinivasan, San Jose, CA (US); Ravi Gutala, San Jose, CA (US); Scott Weber, Piedmont, CA (US); Aravind Dasu, Milpitas, CA (US); Mahesh Iyer, Fremont, CA (US); Eriko Nurvitadhi, Beaverton, OR (US)

(73) Assignee: Altera Corporation, San Jose, CA (US)

( * ) Notice: Subject to any disclaimer, the term of this patent is extended or adjusted under 35 U.S.C. 154(b) by 763 days.

(21) Appl. No.: 17/350,577

(22) Filed: Jun. 17, 2021

(65) Prior Publication Data

US 2021/0313991 A1 Oct. 7, 2021

(51) Int. Cl.
*H03K 19/17788* (2020.01)
*H03K 19/17728* (2020.01)
*H03K 19/17792* (2020.01)

(52) U.S. Cl.
CPC .. *H03K 19/17788* (2013.01); *H03K 19/17728* (2013.01); *H03K 19/17792* (2013.01)

(58) Field of Classification Search
None
See application file for complete search history.

(56) References Cited

U.S. PATENT DOCUMENTS

| 6,967,416 | B2 | 11/2005 | Clevenger et al. | |
|---|---|---|---|---|
| 10,243,561 | B2 | 3/2019 | Srinivasan et al. | |
| 10,291,397 | B2 | 5/2019 | McElheny et al. | |
| 10,666,265 | B2 | 5/2020 | Clark et al. | |
| 10,833,679 | B2 | 11/2020 | Clark et al. | |
| 2011/0173462 | A1* | 7/2011 | Wakrat | G06F 1/3203 |
| | | | | 713/300 |
| 2012/0250443 | A1 | 10/2012 | Saraswat et al. | |
| 2015/0070056 | A1* | 3/2015 | Tanadi | H03K 17/223 |
| | | | | 327/143 |
| 2016/0370837 | A1* | 12/2016 | Shi | G06F 1/324 |

(Continued)

OTHER PUBLICATIONS

European Patent Office, Extended European Search Report and European Search Opinion for European patent application 22159985.5, dated Aug. 29, 2022.

*Primary Examiner* — Jany Richardson
(74) *Attorney, Agent, or Firm* — InventIQ Legal LLP; Steven J. Cahill

(57) ABSTRACT

A circuit system includes a first integrated circuit die having a first group of circuits configured to perform a first set of operations. The circuit system also includes a second integrated circuit die having a second group of circuits configured to start performing a second set of operations with a delay after the first group of circuits starts performing the first set of operations to reduce power supply voltage droop. The operations performed by the first and second groups of circuits can be interleaved with a fixed or a variable delay. Logic circuits can be partitioned into the first and the second groups of circuits based on predicted switching activity of the logic circuits. Decoupling capacitors in integrated circuit dies can be coupled together to reduce droop in a supply voltage during a high current event.

22 Claims, 8 Drawing Sheets

(56) References Cited

U.S. PATENT DOCUMENTS

| | | |
|---|---|---|
| 2018/0143777 A1 | 5/2018 | Dasu et al. |
| 2018/0143860 A1 | 5/2018 | Dasu et al. |
| 2019/0012116 A1 | 1/2019 | Gutala et al. |
| 2019/0041923 A1 | 2/2019 | Atsatt et al. |
| 2019/0042127 A1 | 2/2019 | Weber et al. |
| 2019/0043536 A1 | 2/2019 | Weber et al. |
| 2019/0044514 A1 | 2/2019 | Srinivasan et al. |
| 2019/0044515 A1 | 2/2019 | Gutala et al. |
| 2019/0044519 A1 | 2/2019 | Atsatt et al. |
| 2020/0119736 A1 | 4/2020 | Weber et al. |
| 2022/0130432 A1* | 4/2022 | Jayapal .................. G06F 1/305 |

* cited by examiner

CIRCUIT SYSTEMS AND METHODS FOR REDUCING POWER SUPPLY VOLTAGE DROOP

FIELD OF THE DISCLOSURE

The present disclosure relates to electronic integrated circuits systems, and more particularly, to circuit systems and methods for reducing power supply voltage droop.

BACKGROUND

Programmable integrated circuits are a type of integrated circuit that can be programmed by a user to implement desired custom logic functions. In a typical scenario, a logic designer uses computer-aided design tools to design a custom logic circuit. When the design process is complete, the computer-aided design tools generate configuration data. The configuration data is loaded into memory elements on a programmable integrated circuit to configure the programmable integrated circuit to perform the functions of the custom logic circuit. A field-programmable gate array (FPGA) is one type of programmable integrated circuit.

DETAILED DESCRIPTION

Operations in an integrated circuit (IC), such as an FPGA, can often draw large supply currents within a short time period from a power delivery network (PDN) that provides a supply voltage to the IC, which can result in large power delivery noise that negatively impacts device performance and functionality. One way to mitigate the power delivery noise is by implementing staging, which involves dividing an operation into multiple stages, executing one stage at a time, and waiting for the current stage to finish before starting another stage. Sequential staging helps mitigate noise, but may require more time.

During high supply current draw events from a PDN on an FPGA, voltage droop may develop in the power supply voltage. Voltage droop analysis for an FPGA design for large supply current draws is more challenging than for a standard ASIC (Application-Specific Integrated Circuit) design, because ASIC designs have fewer power domains and employ power gating. FPGA design, on the other hand, has many more power domains and cross-domain signals, so the interaction among the different power supply voltages is more complex.

According to some embodiments disclosed herein, groups of circuits in multiple integrated circuit (IC) dies are operated at different times to reduce current during high current events. Instead of starting high current operations simultaneously, two or more operation threads can be interleaved with a delay, or staged sequentially, so that the high current events are not aligned. A "high current event" may be defined as any loading event that causes the power delivery network of an integrated circuit die to exhibit current spikes exceeding a predetermined current threshold level (e.g., 0.2 ampere (A), 0.4 A, 0.8 A, 1 A, 5 A, 10 A, etc.) or that causes the power delivery network to exhibit a voltage perturbation such as a voltage droop or voltage peak from the nominal power supply voltage level exceeding a predetermined voltage threshold level (e.g., 5 millivolts (mV), 10 mV, 20 mV, 50 mV, etc.). Delayed processing among multiple IC dies can be achieved via interleaving or sequential staging to improve operational efficiency without substantially increasing noise.

It will be recognized by one skilled in the art, that the present exemplary embodiments may be practiced without some or all of these specific details. In other instances, well-known operations have not been described in detail in order not to unnecessarily obscure the present embodiments.

Figure 1:
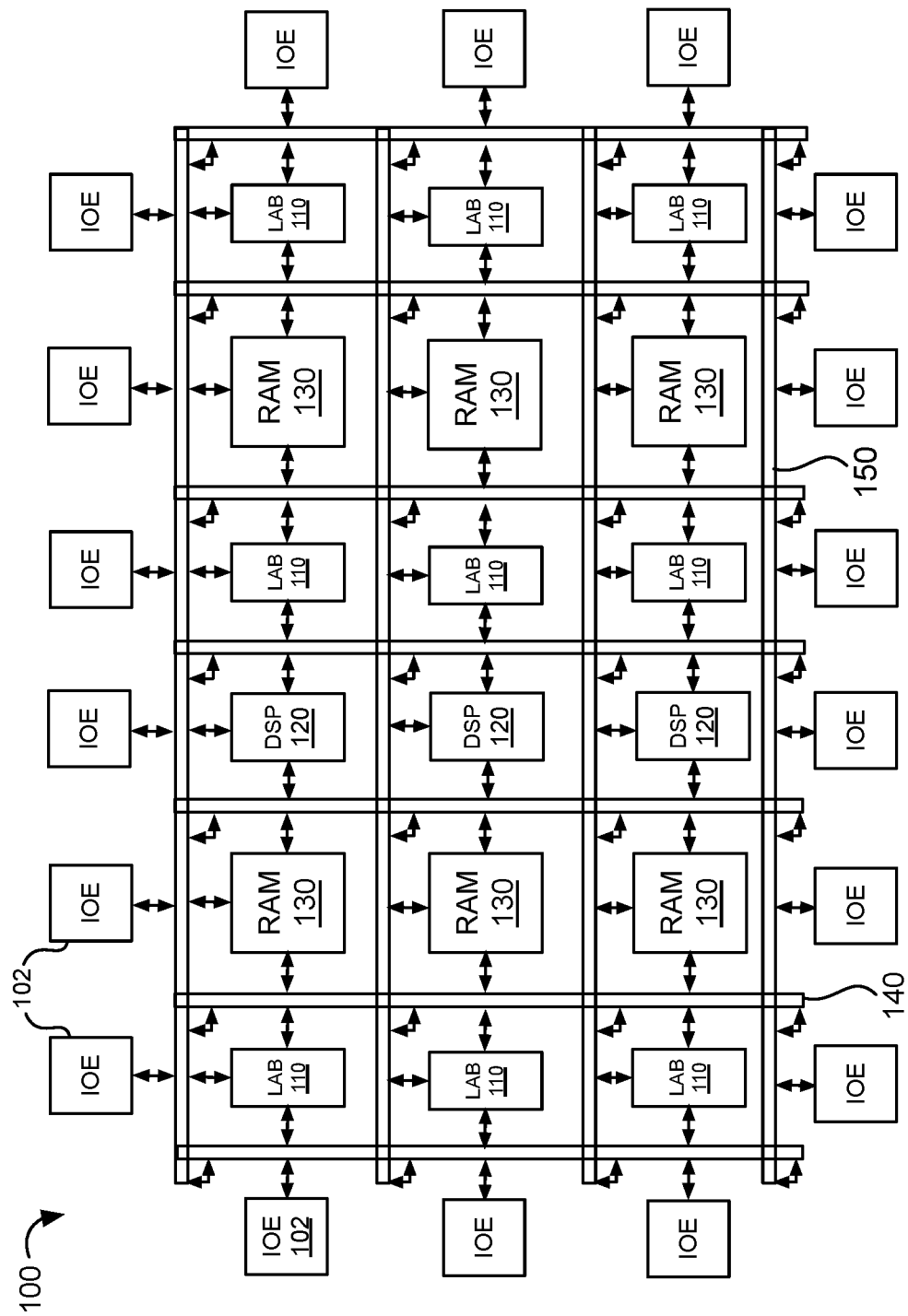
FIG. 1 illustrates an embodiment of a programmable logic device (PLD) having exemplary interconnect circuitry, according to an embodiment.

An illustrative embodiment of an integrated circuit die such as programmable logic device (PLD) 100 having exemplary interconnect circuitry is shown in Figure (FIG. 1. As shown in FIG. 1, the programmable logic device (PLD) 100 may include a two-dimensional array of functional blocks, including logic array blocks (LABs) 110 and other functional blocks, such as random access memory (RAM) blocks 130 and digital signal processing (DSP) blocks, such as DSP blocks 120. Functional blocks such as LABs 110 may include smaller programmable regions (e.g., logic circuits, configurable logic blocks, or adaptive logic modules) that receive input signals and perform custom functions on the input signals to produce output signals.

Programmable logic device 100 may contain memory elements. The memory elements may be loaded with configuration data (also called programming data) using input/output elements (IOEs) 102. Once loaded, the memory elements each provide a corresponding static control signal that controls the operation of an associated functional block (e.g., LABs 110, DSP blocks 120, RAM blocks 130, or input/output elements 102).

In a typical scenario, the outputs of the loaded memory elements are applied to the gates of metal-oxide-semiconductor field-effect transistors in a functional block to turn transistors on or off and thereby configure the logic in the functional block including the routing paths. Programmable logic circuit elements that may be controlled in this way include parts of multiplexers (e.g., multiplexers used for forming routing paths in interconnect circuits), look-up tables, logic arrays, AND, OR, NAND, and NOR logic gates, pass gates, etc.

The memory elements may use any suitable volatile and/or non-volatile memory structures such as randomaccess-memory (RAM) cells, fuses, antifuses, programmable read-only-memory memory cells, mask-programmed and laser-programmed structures, mechanical memory devices (e.g., including localized mechanical resonators), mechanically operated RAM (MORAM), combinations of these structures, etc. Because the memory elements are loaded with configuration data during programming, the memory elements are sometimes referred to as configuration memory, configuration RAM (CRAM), configuration memory elements, or programmable memory elements.

In addition, the programmable logic device 100 may have input/output elements (IOEs) 102 for driving signals off of device 100 and for receiving signals from other devices. Input/output elements 102 may include parallel input/output circuitry, serial data transceiver circuitry, differential receiver and transmitter circuitry, or other circuitry used to connect one integrated circuit to another integrated circuit. As shown, input/output elements 102 may be located around the periphery of the chip. If desired, the programmable logic device 100 may have input/output elements 102 arranged in different ways.

The PLD 100 may also include programmable interconnect circuitry in the form of vertical routing channels 140 (i.e., interconnects formed along a vertical axis of PLD 100) and horizontal routing channels 150 (i.e., interconnects formed along a horizontal axis of PLD 100), each routing channel including at least one track to route at least one wire. If desired, the interconnect circuitry may include double data rate interconnections and/or single data rate interconnections.

Note that other routing topologies, besides the topology of the interconnect circuitry depicted in FIG. 1 can be used with the present embodiments. For example, the routing topology may include diagonal wires, horizontal wires, and vertical wires along different parts of their extent as well as wires that are perpendicular to the device plane in the case of three dimensional integrated circuits, and the driver of a wire may be located at a different point than one end of a wire. The routing topology may include global wires that span substantially all of PLD 100, fractional global wires such as wires that span part of PLD 100, staggered wires of a particular length, smaller local wires, or any other suitable interconnection resource arrangement.

Furthermore, it should be understood that the embodiments described herein may be implemented in any type of integrated circuit. If desired, the functional blocks of such an integrated circuit may be arranged in more levels or layers in which multiple functional blocks are interconnected to form still larger blocks. Other device arrangements may use functional blocks that are not arranged in rows and columns.

Figure 2:
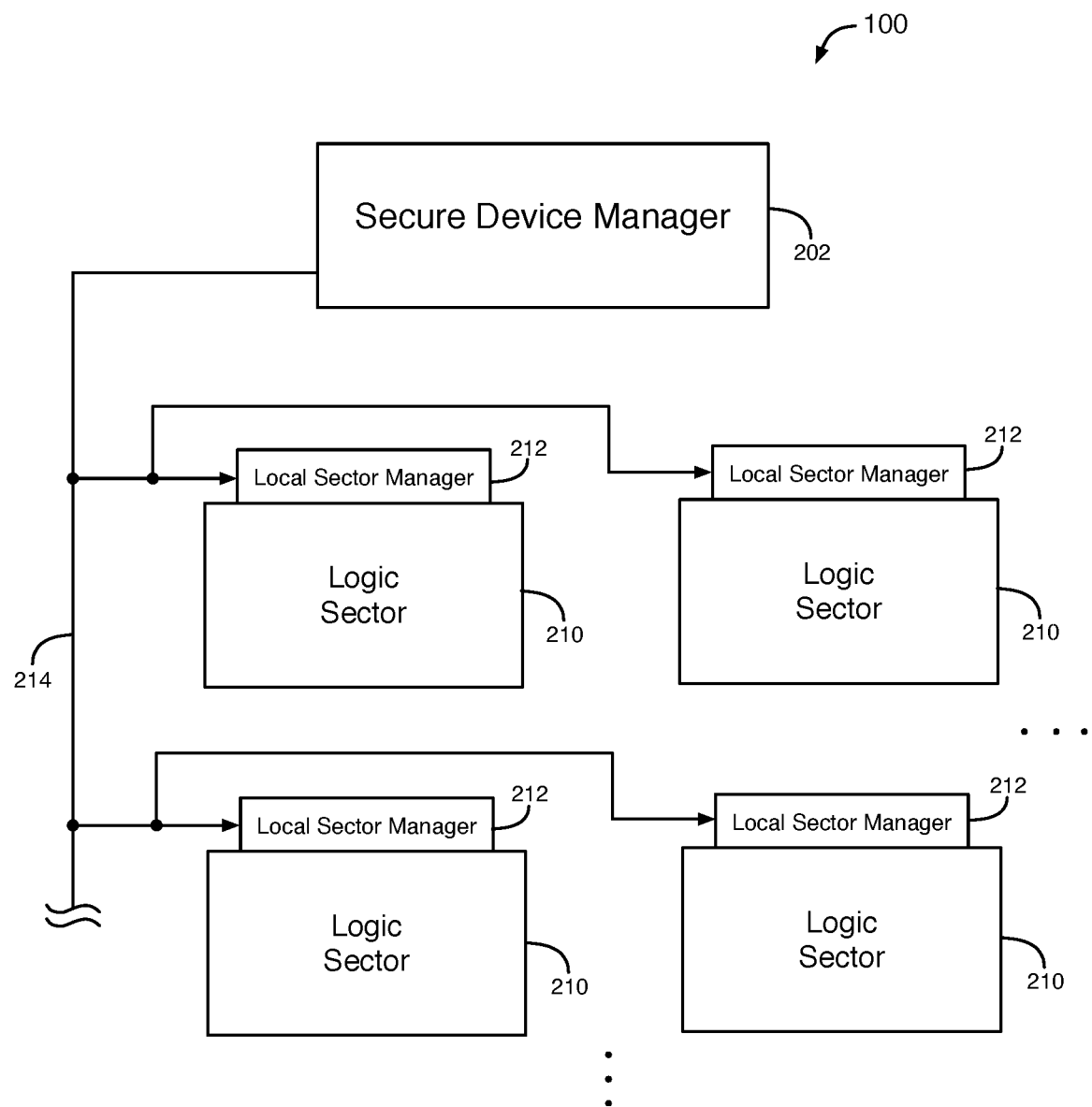
FIG. 2 illustrates an example of logic circuitry in the PLD of FIG. 1, according to an embodiment.

In one suitable arrangement, the logic circuitry in PLD 100 may be organized into logic sectors as shown, for example, in FIG. 2. As shown in FIG. 2, device 100 may include multiple logic sectors 210. Each logic sector 210 may, for example, include several programmable logic circuits. Each logic sector 210 may be managed by a respective local sector manager (LSM) 212. Local sector managers 212 may be controlled by a secure controller such as secure device manager (SDM) 202. Secure device manager 202 may receive configuration data (e.g., configuration bit streams) and commands from an external host and may then provide the received commands and configuration data to local sector managers 212 over a bus 214. Bus 214 coupling secure device manager 202 to local sector managers 212 may sometimes be referred to as a configuration network-on-chip (CNoC).

Figure 3:
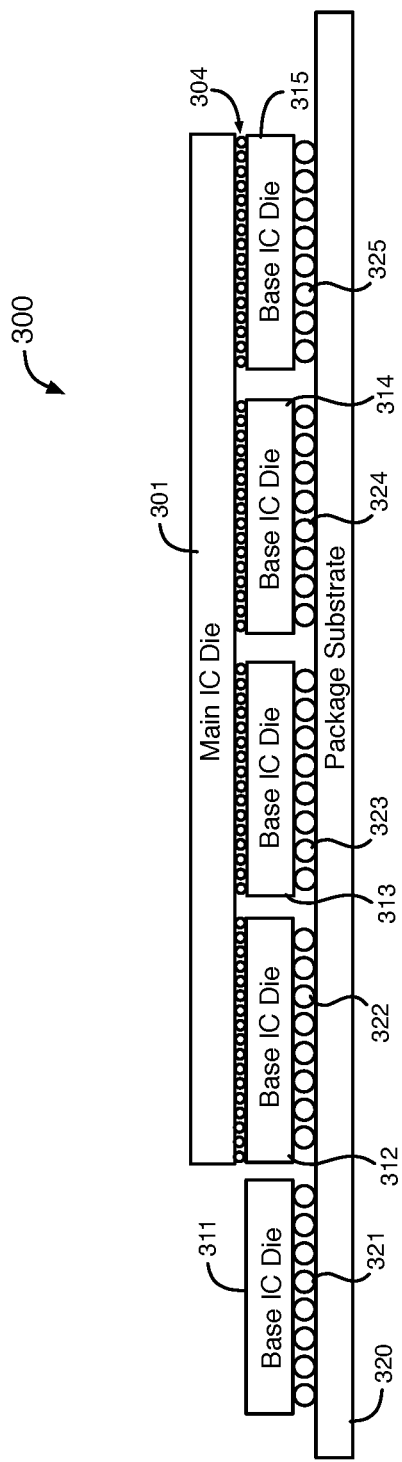
FIG. 3 illustrates a cross section of an exemplary integrated circuit (IC) package that includes a main integrated circuit (IC) die, 5 base IC dies, and a package substrate, according to an embodiment.

FIG. 3 illustrates a cross section of an exemplary integrated circuit (IC) package 300 that includes a main integrated circuit (IC) die 301, 5 base IC dies 311-315, and a package substrate 320, according to an embodiment. The main IC die 301 may be any type of IC die, such as a programmable logic IC (e.g., PLD 100), a microprocessor IC, a graphics processing unit (GPU) IC, etc. Base IC dies 311-315 may also be any types of IC dies, such as memory ICs, programmable logic ICs (e.g., FPGAs), microprocessor ICs, GPU ICs, etc.

The main IC die 301 and the base IC dies 312-315 are vertically stacked and coupled together as shown in FIG. 3 to create a three dimensional (3D) circuit system. The main IC die 301 is coupled to the base IC dies 312-315 through several conductive connections 304. Base IC dies 312-315 can communicate with main IC die 301 via connections 304. The base IC dies 311-315 are coupled to the package substrate 320 through conductive connections 321-325, respectively. Base IC die 311 can communicate with main IC die 301, for example, via connections 321, conductors in package substrate 320, one or more sets of connections 322-325, through silicon vias in one or more of base IC dies 312-315, and connections 304.

There are various modes in which device 100 may be operated (e.g., in a simultaneous mode or a sequential mode). In simultaneous mode, all logic sectors 210 are started at the same time. Operating in simultaneous mode requires the least amount of time to finish a task. However, the resulting peak current drawn from the power delivery network (PDN) may be unacceptably large, as the current of all involved logic sectors are aligned. In sequential mode, a new operation is started only after the current operation is completed. The resulting peak current is smaller in sequential mode, but sequential mode may require a more time consuming process for the entire device 100.

Figure 4A:
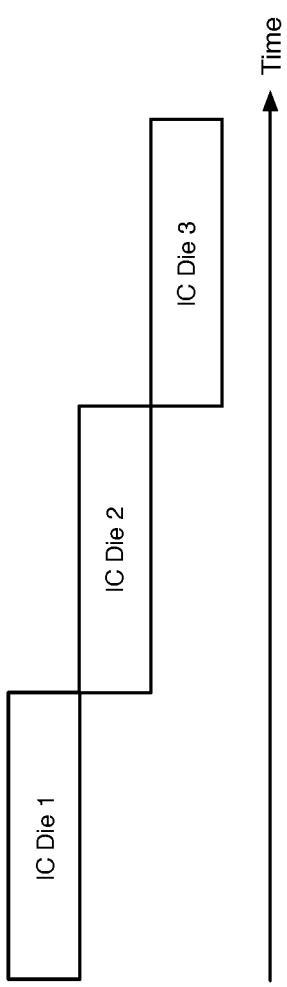
FIGS. 4A-4B are timing diagrams that illustrate examples of sequentially processing threads in groups of circuits among multiple integrated circuit (IC) dies in a circuit system, according to an embodiment.
Figure 4B:
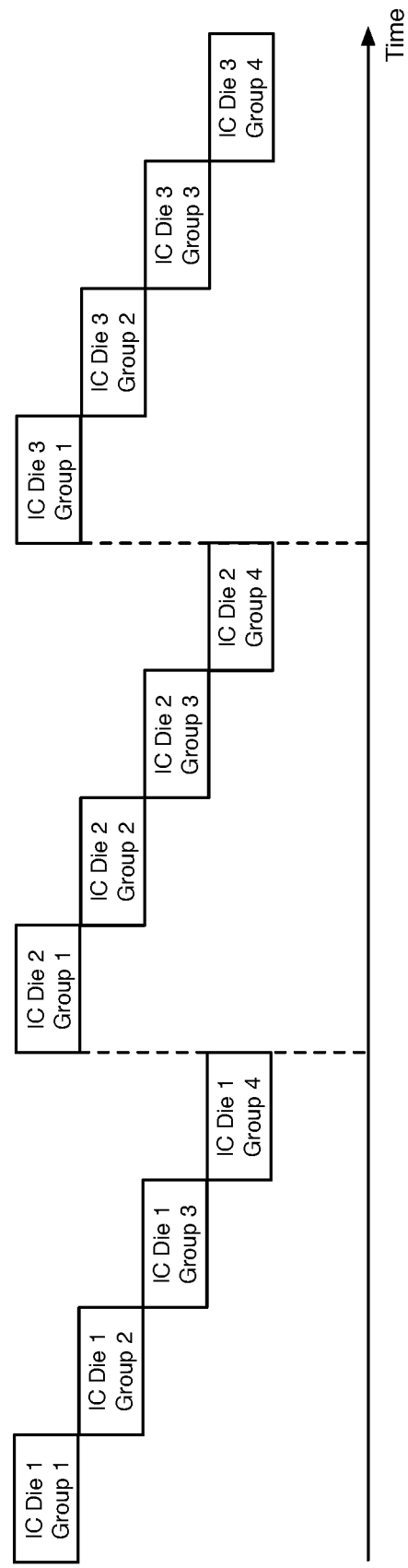

According to some embodiments disclosed herein, groups of circuits in multiple integrated circuit (IC) dies are operated sequentially to reduce the current on one or more power delivery networks during high current events. Instead of starting high current operations simultaneously, two or more operation threads are processed sequentially so that the high current events are not aligned. FIGS. 4A-4B are timing diagrams that illustrate examples of sequentially processing threads in groups of circuits among multiple integrated circuit (IC) dies in a circuit system, according to an embodiment. According to various embodiments, each of the groups of circuits may be, for example, one or more portions of logic sectors 210, one or more rows or columns of memory circuit cells in RAM blocks 130, one or more portions of LABs 110, one or more portions of DSP blocks 120, or any combination thereof. The groups of circuits may have an identical circuit structure. The three IC dies 1, 2, and 3 disclosed herein with respect to FIGS. 4A-4B may be, for example, any three of the base IC dies 311-315 of FIG. 3. Although three IC dies are disclosed with respect to FIGS. 4A-4B, the sequential processing operations of FIGS. 4A-4B may be applied to 2, 3, 4, 5, 6, or more IC dies.

FIG. 4A shows that portions of operation threads in the three IC dies 1, 2, and 3 are performed sequentially one after the other, such that the execution of operation threads in each of the three IC dies do not overlap with the execution of operation threads in any of the other IC dies. Operation threads are not executed in the groups of circuits of IC die 2, until operation threads in the groups of circuits of IC die 1 are completed. Also, operation threads are not executed in the groups of circuits of IC die 3, until operation threads in the groups of circuits of IC dies 1 and 2 are completed.

FIG. 4B shows that the operation threads in the groups of circuits within each of the three IC dies 1-3 are also performed sequentially, such that the execution of the operation threads in each of the groups of circuits in each of the three IC dies do not overlap with the execution of operation threads in any of the other groups of circuits. Each of the operation threads may include one or more operations. As shown in FIG. 4B, operation threads in each of 4 different groups of circuits in each IC die 1-3 are performed sequentially and do not overlap. As a result, any voltage droop in the supply voltage on the PDN of the active IC die is reduced, because each peak current event caused by an operation thread occurs when only one group of circuits is operating.

Initially, a first group 1 of circuits in IC die 1 performs operations associated with a first operation thread. After group 1 of circuits in IC die 1 has completed the operations associated with the first operation thread, a second group 2 of circuits in IC die 1 performs operations associated with a second operation thread. After group 2 of circuits in IC die 1 has completed the operations associated with the second operation thread, a third group 3 of circuits in IC die 1 performs operations associated with a third operation thread. After group 3 of circuits in IC die 1 has completed the operations associated with the third operation thread, a fourth group 4 of circuits in IC die 1 performs operations associated with a fourth operation thread.

After group 4 of circuits in IC die 1 has completed the operations associated with the fourth operation thread, a first group 1 of circuits in IC die 2 performs operations associated with the first operation thread. After group 1 of circuits in IC die 2 has completed the operations associated with the first operation thread, a second group 2 of circuits in IC die 2 performs operations associated with the second operation thread. After group 2 of circuits in IC die 2 has completed the operations associated with the second operation thread, a third group 3 of circuits in IC die 2 performs operations associated with the third operation thread. After group 3 of circuits in IC die 2 has completed the operations associated with the third operation thread, a fourth group 4 of circuits in IC die 2 performs operations associated with the fourth operation thread.

After group 4 of circuits in IC die 2 has completed the operations associated with the fourth operation thread, a first group 1 of circuits in IC die 3 performs operations associated with the first operation thread. After group 1 of circuits in IC die 3 has completed the operations associated with the first operation thread, a second group 2 of circuits in IC die 3 performs operations associated with the second operation thread. After group 2 of circuits in IC die 3 has completed the operations associated with the second operation thread, a third group 3 of circuits in IC die 3 performs operations associated with the third operation thread. After group 3 of circuits in IC die 3 has completed the operations associated with the third operation thread, a fourth group 4 of circuits in IC die 3 performs operations associated with the fourth operation thread.

Referring again to FIG. 2, logic sectors 210 may be individually configurable or programmable using the associated local sector manager 212, which allows each of logic sectors 210 to independently process different tasks in parallel. The parallel processing enabled by logic sectors 210 may be utilized to perform application acceleration (e.g., in a datacenter) for a variety of tasks or jobs simultaneously by reconfiguring different subsets of the logic sectors to perform the different tasks.

In accordance with another embodiment, in interleaving mode, all operation threads performed in one or more groups of circuits are started one after another with delays. Operated in this way, peak current drawn from the power delivery network (PDN) that provides a supply voltage to the IC can be reduced, while improving the operation efficiency. In other words, interleaving is a technique used to operate multiple groups of circuits with delay between each operation thread. The noise peaking occurs in the period right after a current step happens and is soon attenuated. Device 100 loads instructions or waits for data before a subsequent operation, which may create a low current consumption period between high current consumption periods. Adding a proper delay between individual operation threads helps to reduce peak current draw from the power delivery network by distributing the current draw over time. Efficiency may be improved with increased parallelism.

Figure 5A:
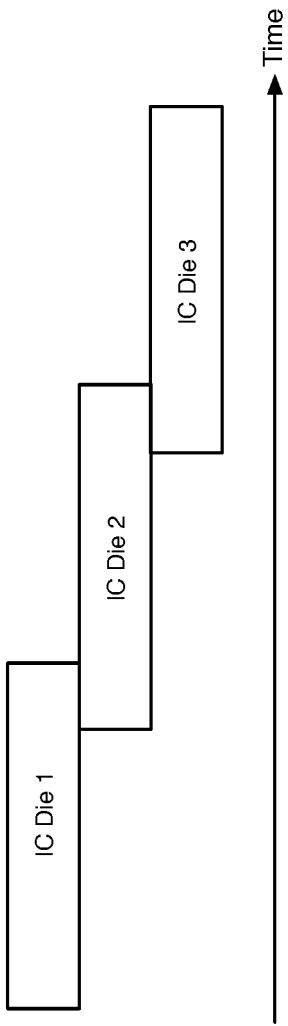
FIGS. 5A-5B are timing diagrams that illustrate examples of interleaving operation threads in groups of circuits among multiple integrated circuit (IC) dies in a circuit system, according to an embodiment.
Figure 5B:
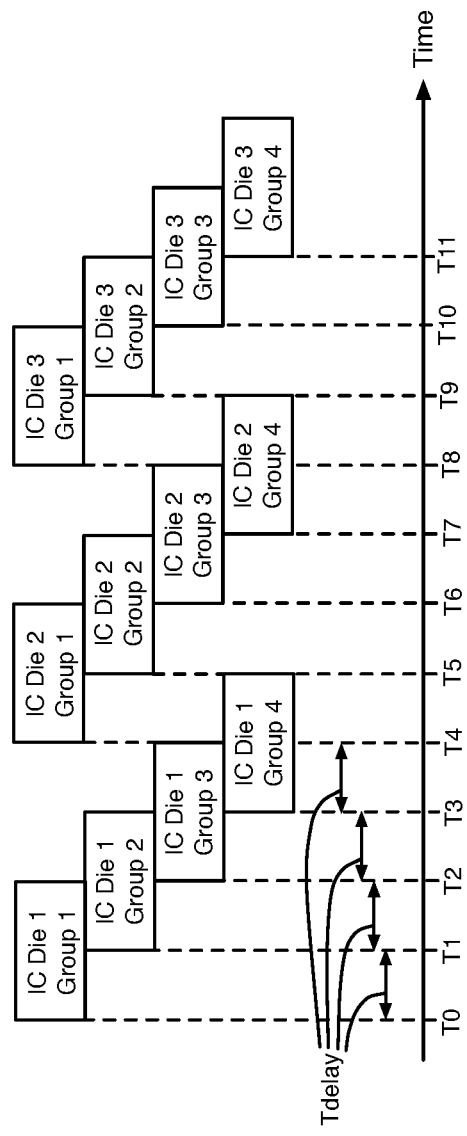

FIGS. 5A-5B are timing diagrams that illustrate examples of interleaving operation threads among groups of circuits in multiple integrated circuit (IC) dies in a circuit system, according to an embodiment. According to various embodiments, each of the groups of circuits may be, for example, one or more portions of logic sectors 210, one or more rows or columns of memory circuit cells in RAM blocks 130, one or more portions of LABs 110, one or more portions of DSP blocks 120, or any combination thereof. The groups of circuits may, for example, have an identical circuit structure. The three IC dies 1, 2, and 3 disclosed herein with respect to FIGS. 5A-5B may be, for example, any three of the base IC dies 311-315 of FIG. 3. Although three IC dies 1-3 are disclosed in FIGS. 5A-5B, the interleaved processing operations of FIGS. 5A-5B may be applied to 2, 3, 4, 5, 6, or more IC dies.

FIG. 5A shows that the operation threads in the three IC dies 1, 2, and 3 are interleaved. In the interleaved mode of FIG. 5A, the execution of an operation thread in IC die 2 partially overlaps with the execution of an operation thread in IC die 1, and the execution of an operation thread in IC die 3 partially overlaps with the execution of an operation thread in IC die 2.

FIG. 5B shows that the operation threads in the groups of circuits within each of the three IC dies 1-3 are also interleaved. Thus, the execution of each operation thread in each of the groups of circuits in each of the three IC dies partially overlaps with the execution of one or more of the operation threads in one or more of the other groups of circuits in the same IC die and/or in a different IC die. As shown in FIG. 5B, the execution of each operation thread in each group of circuits overlaps by a time delay Tdelay with the execution of an operation thread in at least one other group of circuits. In the example of FIG. 5B, the execution of each operation thread in each group of circuits in each IC die has the same duration Tstage, and Tdelay equals one-half of the duration Tstage of the execution of each operation thread in each group of circuits (i.e., Tdelay=Tstage/2). In other embodiments, Tdelay may equal one-third, one-fourth, one-fifth, one-sixth, or another fraction of the duration Tstage of the execution of each operation thread in each group of circuits. In these embodiments, Tdelay is a fixed delay. In still other embodiments, Tdelay may be a variable delay that varies based on the bit level switching activity in the groups of circuits currently executing operation threads. For example, the timing of the arrival of data patterns that are used by a group of circuits performing an operation thread may cause an increase in the bit level switching activity (and the resulting power supply current draw) to a level that may cause a delay in the start of the operation thread in the next group of circuits. In this example, Tdelay increases to accommodate the increased switching activity and power supply current draw. As another example, if the bit level switching activity in a group of circuits performing an operation thread is low or decreases, Tdelay decreases to cause the next group of circuits to begin the next operation thread sooner. Each of the operation threads may include one or more operations. In some embodiments, the operation threads executed by the groups of circuits in IC dies 1-3 may be the same set of operations, the same types of operations, or different operations.

As shown in FIG. 5B, operation threads in each of 4 different groups of circuits in each IC die are interleaved and thus partially overlap. Operated in this way, the total operating time for the circuit system of FIG. 5B may be reduced by 37.5% compared to the sequential mode. Initially at time T0 in FIG. 5B, a first group 1 of circuits in IC die 1 performs operations associated with a first operation thread. After a delay Tdelay at time T1, a second group 2 of circuits in IC die 1 begins to perform operations associated with a second operation thread. After another delay Tdelay at time T2, group 1 of circuits in IC die 1 has completed the operations associated with the first operation thread, and a third group 3 of circuits in IC die 1 begins to perform operations associated with a third operation thread. After yet another delay Tdelay at time T3, group 2 of circuits in IC die 1 has completed the operations associated with the second operation thread, and a fourth group 4 of circuits in IC die 1 begins to perform operations associated with a fourth operation thread.

After another delay Tdelay at time T4, group 3 of circuits in IC die 1 has completed the operations associated with the third operation thread, and a first group 1 of circuits in IC die 2 begins to perform operations associated with the first operation thread. After another delay Tdelay at time T5, group 4 of circuits in IC die 1 has completed the operations associated with the fourth operation thread, and a second group 2 of circuits in IC die 2 begins to perform operations associated with the second operation thread. After yet another delay Tdelay at time T6, group 1 of circuits in IC die 2 has completed the operations associated with the first operation thread, and a third group 3 of circuits in IC die 2 begins to perform operations associated with the third operation thread. After yet another delay Tdelay at time T7, group 2 of circuits in IC die 2 has completed the operations associated with the second operation thread, and a fourth group 4 of circuits in IC die 2 begins to perform operations associated with the fourth operation thread.

After yet another delay Tdelay at time T8, group 3 of circuits in IC die 2 has completed the operations associated with the third operation thread, and a first group 1 of circuits in IC die 3 begins to perform operations associated with the first operation thread. After yet another delay Tdelay at time T9, group 4 of circuits in IC die 2 has completed the operations associated with the fourth operation thread, and a second group 2 of circuits in IC die 3 begins to perform operations associated with the second operation thread. After yet another delay Tdelay at time T10, group 1 of circuits in IC die 3 has completed the operations associated with the first operation thread, and a third group 3 of circuits in IC die 3 begins to perform operations associated with the third operation thread. After yet another delay Tdelay at time T11, group 2 of circuits in IC die 3 has completed the operations associated with the second operation thread, and a fourth group 4 of circuits in IC die 3 begins to perform operations associated with the fourth operation thread.

The four-way interleaving scheme of FIG. 5B is merely illustrative and does not serve to limit the scope of the present embodiments. If desired, a two-way interleaving scheme, a three-way interleaving scheme, or an interleaving scheme involving more than four overlapping operation threads may be implemented. In general, each operation thread may execute on any number of logic sectors, logic circuits, or regions in parallel. Moreover, Tdelay may be adjusted as needed depending on the amount of supply current loading exhibited when a particular group of logic sectors or other group of circuits is initiated. For instance, if the supply current peak is high, Tdelay may be increased to ensure that the voltage droop in the supply voltage has had a chance to recover before initiating a subsequent high current event. If the supply current peak is low, Tdelay may be decreased to help further increase operational efficiency.

Figure 6:
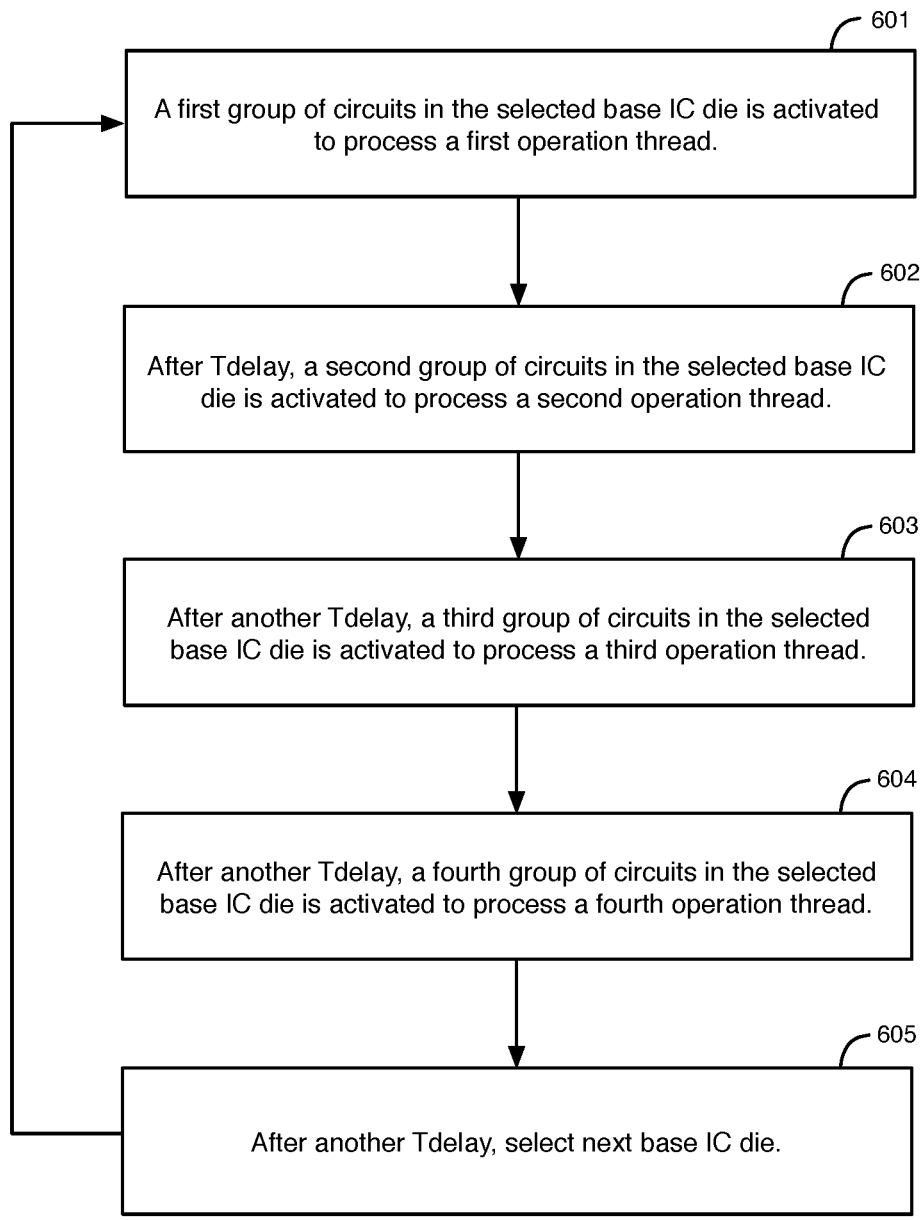
FIG. 6 is a flow chart of illustrative operations for the embodiments of FIGS. 4A-5B, according to an embodiment.

FIG. 6 is a flow chart of illustrative operations for the embodiments of FIGS. 4A-5B, according to an embodiment. At operation 601, a first group of circuits in a selected base IC die (e.g., one of base IC dies 311-315) is activated to process a first operation thread. In the first iteration of operations 601-604, the selected base IC die may be IC die 1 of FIGS. 4A-4B or 5A-5B. The operations associated with each operation thread may cause a high current event in the selected base IC die. After a delay Tdelay at operation 602, a second group of circuits in the selected base IC die is activated to process a second operation thread. The delay Tdelay may be, for example, equal to the duration Tstage of each operation thread in each group of circuits (e.g., as in the example of FIG. 4B), equal to one-half the duration Tstage (e.g., as in the example of FIG. 5B), or another fraction of Tstage (e.g., ⅓, ¼, etc.). As discussed above, Tdelay may be a fixed delay or a variable delay that varies based on the bit level switching activity in the groups of circuits currently executing operation threads. In the embodiments in which Tdelay is a variable delay, the Tdelay may vary between two or more of the operations 601-605 of FIG. 6.

After another delay Tdelay at operation 603, a third group of circuits in the selected base IC die is activated to process a third operation thread. After yet another delay Tdelay at operation 604, a fourth group of circuits in the selected base IC die is activated to process a fourth operation thread. After yet another delay Tdelay at operation 605, the next base IC die in the circuit system is selected to perform operation threads. For example, in the first iteration of operation 605, IC die 2 may be selected. As another example, IC die 3 may be selected in the second iteration of operation 605. After each iteration of operation 605, operations 601-604 are performed again for the newly selected base IC die. Operations 601-605 may be repeated until all of the base IC dies in the circuit system have been selected and executed. Each of the operation threads may, for example, perform the same operations or different operations. Operations 601-605 may, for example, be performed by one or more state machine circuits in the main IC die and/or in the base IC dies, as disclosed herein, for example, with respect to FIG. 7.

As discussed above, an IC, such as an FPGA, may draw large supply currents from a power delivery network (PDN) in a short time, which can result in large power delivery noise that negatively impacts performance and functionality of the IC. One way to mitigate the power delivery noise is to increase the capacitance of on-die decoupling capacitors in the IC. However, increasing the capacitance of on-die decoupling capacitors increases the IC die area and significantly increases cost. The amount of decoupling capacitance needed to mitigate high supply current events may be prohibitively large.

Figure 7:
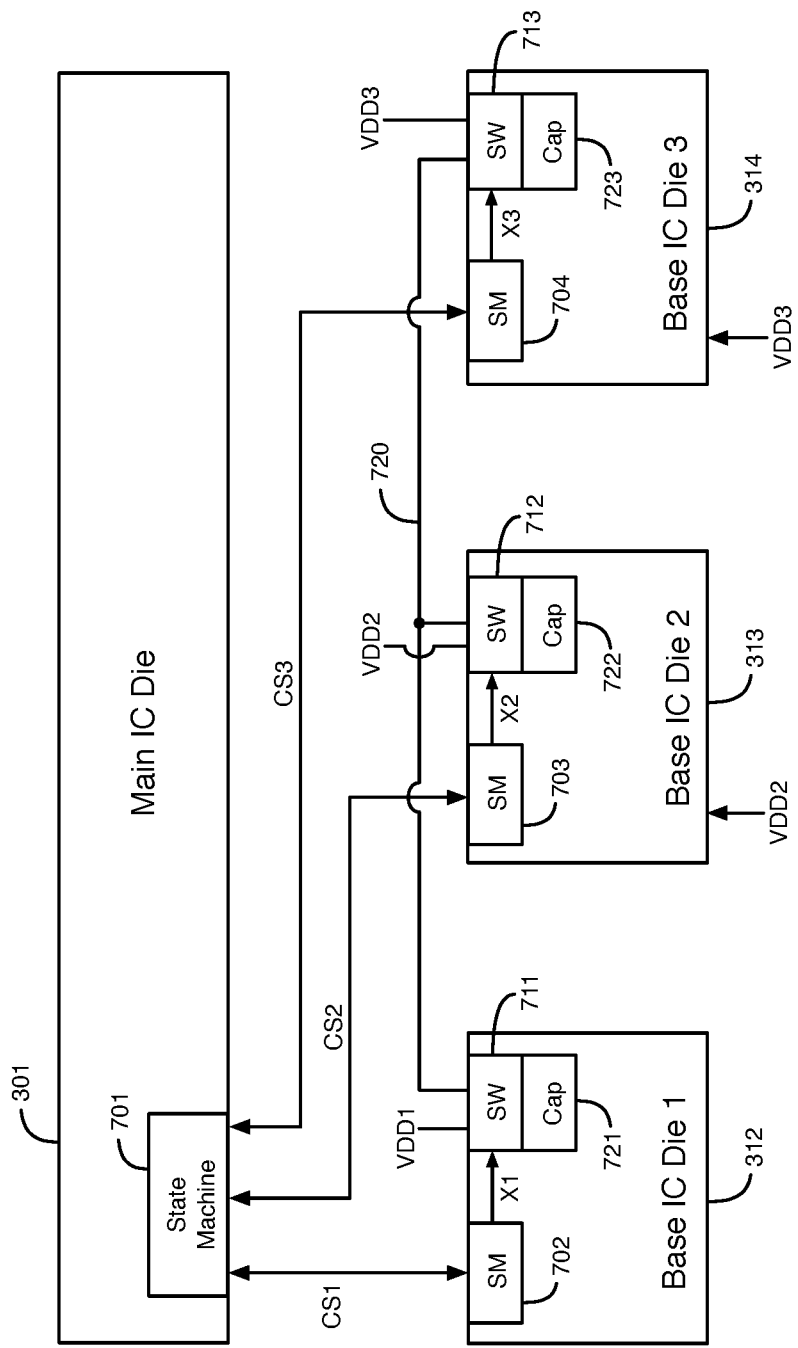
FIG. 7 illustrates further details of an exemplary portion of the IC package of FIG. 3, including the main IC die and the base IC dies, according to an embodiment.
Figure 8:
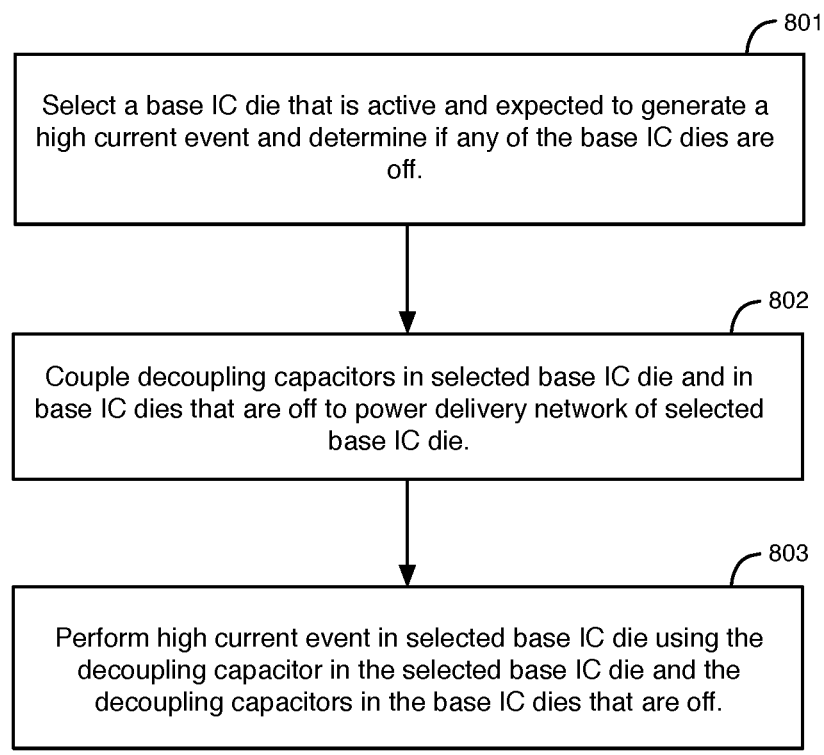
FIG. 8 is a flow chart that illustrates examples of operations that may be performed by the integrated circuits in the IC package of FIG. 3 to reduce supply voltage droop, according to an embodiment.

According to some embodiments that are disclosed herein with respect to FIGS. 7-8, an active integrated circuit (IC) die may use a decoupling capacitor in one or more additional IC dies on demand to reduce the voltage droop in a supply voltage on a PDN during a high current event in the active IC die. As a result, the need for adding additional on-die decoupling capacitance in the active IC die is significantly reduced, thereby reducing IC die area and cost.

FIG. 7 illustrates further details of an exemplary portion of the IC package 300 of FIG. 3 including main IC die 301 and base IC dies 312-314, according to an embodiment. In the embodiment of FIG. 7, the main IC die 301 includes a state machine circuit 701, the base IC die 312 includes a state machine (SM) circuit 702, the base IC die 313 includes a state machine circuit 703, and the base IC die 314 includes a state machine circuit 704. Also, the base IC die 312 includes a decoupling capacitor 721 and a switching (SW) circuit 711, the base IC die 313 includes a decoupling capacitor 722 and a switching circuit 712, and the base IC die 314 includes a decoupling capacitor 723 and a switching circuit 713.

State machine circuits 701-704 may, for example, be implemented using programmable logic circuits or using non-programmable logic circuits (i.e., hardwired circuitry). State machine circuit 701 controls the operation of state machine circuits 702-704 using bidirectional control signals CS1, CS2, and CS3, respectively. Three supply voltages VDD1, VDD2, and VDD3 on three different power delivery networks are shown in FIG. 7. Supply voltages VDD1, VDD2, and VDD3 are provided to inputs of switching circuits 711, 712, and 713, respectively. State machine circuits 702, 703, and 704 control the switching of switching circuits 711, 712, and 713 using control signals X1, X2, and X3, respectively. Switching circuits 711, 712, and 713 are coupled to decoupling capacitors 721, 722, and 723, respectively. Switching circuits 711-713 are coupled together through connections 720 (e.g., in package substrate 320).

In the embodiment of FIG. 7, any one of the base IC dies 312-315 that is currently on and active can use the decoupling capacitors 721-723 on demand in one or more of the other 3 base IC dies that are currently off. IC die 315 is not shown in FIG. 7.

The decoupling capacitor in the active IC die may be coupled to the decoupling capacitors in 1, 2, or 3 of the off base IC dies during a high current event in the active base IC die to reduce voltage droop in the supply voltage VDD1-VDD3 delivered to the active base IC die. 1, 2, or 3 of the other base IC dies are off during the high current event in the active base IC die. The base IC dies that are off are not using their decoupling capacitors, and therefore, the base IC dies that are off can allow the active base IC die to use their decoupling capacitors to reduce droop in the supply voltage.

State machine circuit 701 controls the use of the decoupling capacitors 721-723 in the base IC dies 312-314 on demand using control signals CS1-CS3, respectively, to reduce supply voltage droops and spikes in the active base IC die. State machine circuit 701 can communicate with state machines 702-704 using bidirectional control signals CS1-CS3 to determine which of the three base IC dies 312-314 are active and which of the base IC dies 312-314 are off, respectively. State machines 702-704 can send signals (e.g., subsets of signals CS1-CS3) to state machine 701 that indicate if their respective base IC dies 312-314 are active or off. If state machine 701 determines (e.g., using control signals CS1-CS3) that one of the base IC dies 312-314 is active and expected to generate a high current event and that one or both of the other two base IC dies 312-314 are off, then state machine 701 may generate control signals CS1-CS3 that cause state machines 702-704 to couple 2 or 3 of the decoupling capacitors 721-723 together through switching circuits 711-713, respectively, and through connections 720.

As a specific example that is not intended to be limiting, the main IC die 301 may be an FPGA, and the base IC dies 312-314 may be memory IC dies that store configuration data for configuring logic sectors 210 that are above the base IC dies in the main IC die 301. In this example, any of the base IC dies 312-314 may provide configuration data to main IC die 301 for performing partial reconfiguration of logic sectors 210 in the main IC die 301, while one or both of the other base IC dies are off. In this example, providing the configuration data from one of the base IC dies that is active to the main IC die 301 may cause a high current event in the active base IC die that results in a voltage droop or spike in the supply voltage in the active base IC die.

For example, if state machine 701 determines from signals CS1-CS3 that base IC die 312 is active and expected to generate a high current event and that base IC dies 313-314 are off, then state machine 701 may generate values in controls signals CS1-CS3 that cause state machines 702-704 to couple together decoupling capacitors 721-723 through switching circuits 711-713 and connections 720 to reduce voltage droops and spikes in supply voltage VDD1 during the high current event. State machine 702 causes switching circuit 711 to couple capacitor 721 to supply voltage VDD1 and to connections 720 while base IC die 312 is active using signals X1. State machines 703-704 cause switching circuits 712-713 to decouple capacitors 722-723 from supply voltages VDD2-VDD3 and to couple capacitors 722-723 to connections 720 using signals X2-X3, respectively, while base IC dies 313-314 are off. In this example, base IC die 312 can perform functions, such as loading configuration data into main IC die 301 for partial reconfiguration, using decoupling capacitors 721-723 in ⅓ the time it would take for base IC die 312 to perform these function with only decoupling capacitor 721.

As another example, if state machine 701 determines from signals CS1-CS3 that base IC die 313 is active and expected to generate a high current event, base IC die 314 is off, and base IC die 312 is not off, then state machine 701 may generate values in controls signals CS2-CS3 that cause state machines 703-704 to couple together decoupling capacitors 722-723 through switching circuits 712-713 and connections 720 to reduce voltage droops/spikes in supply voltage VDD2 during the high current event. In this example, state machine 702 causes switching circuit 711 to decouple capacitor 721 from connections 720 using signals X1. State machine 703 causes switching circuit 712 to couple capacitor 722 to supply voltage VDD2 and connections 720 using signals X2. State machine 704 causes switching circuit 713 to decouple capacitor 723 from supply voltage VDD3 and to couple capacitor 723 to connections 720 using signals X3.

FIG. 8 is a flow chart that illustrates examples of operations that may be performed by the integrated circuits in the IC package 300 of FIG. 3 to reduce supply voltage droops and spikes, according to an embodiment. In operation 801, state machine circuit 701 selects one of the base IC dies 312-314 that is active and expected to generate a high current event. In operation 801, state machine 701 also determines if any of the other base IC dies 312-314 are off. In operation 802, state machine 701 causes state machine circuits 702-704 to couple the decoupling capacitors 721-723 in the selected base IC die and in the one or two base IC dies that are off to the power delivery network of the selected base IC die using switching circuits 711-713 and connections 720. In operation 803, the selected base IC die performs the high current event using the decoupling capacitor in the selected base IC die and the decoupling capacitors in the base IC dies that are off.

According to other embodiments, state machine 701 in main IC die 301 can dynamically reallocate configuration data (e.g., configuration bitstreams that are used to configure logic sectors 210) between the base IC dies 311-315 using control signals (such as control signals CS1-CS3) in order to shorten the duration of high current events in one or more of the base IC dies that can cause supply voltage droops or spikes. In these embodiments, the main IC die 301 is a programmable logic IC (such as an FPGA) that can be configured according to various user designs. The main IC die 301 can be partially or totally reconfigured for different user designs and different applications. The configuration data for configuration of the logic sectors 210 in main IC die 301 is stored in one or more of the base IC dies 311-315.

Performance targets for the main IC die 301 (such as frequency and speed targets) may change based on changes in the configuration of one or more of the logic sectors 210 caused by loading new configuration data from one or more of the base IC dies 311-315. State machine 701 can dynamically change the staging requirements of the power delivery networks of the base IC dies 311-315 based on supply and demand of power supply current from the base IC dies, for example, by changing which of the logic sectors 210 are reconfigured by configuration data from the base IC dies. State machine 701 can dynamically reallocate configuration data stored in one or more of the base IC dies 311-315 to one or more of the other base IC dies in order to reduce the durations of high current events affecting the PDN of one or more of the base IC dies. As a more specific example, state machine 701 can dynamically change the number of logic circuits or the number of rows/columns of memory cells that are in each group of circuits performing each active operation thread in the embodiments of FIGS. 4A-4B, 5A-5B, and 6 by reallocating configuration data between the base IC dies 311-315.

The following examples pertain to further embodiments. Example 1 is a circuit system comprising: a first integrated circuit die comprising a first group of circuits configured to perform a first set of operations; and a second integrated circuit die comprising a second group of circuits configured to start performing a second set of operations with a delay after the first group of circuits starts performing the first set of operations to reduce power supply voltage droop.

In Example 2, the circuit system of Example 1 may optionally further include, wherein the second group of circuits is configured to start performing the second set of operations before the first group of circuits finishes performing the first set of operations to reduce the power supply voltage droop, and wherein the delay is programmable.

In Example 3, the circuit system of Example 1 may optionally further include, wherein the second group of circuits is configured to start performing the second set of operations after the first group of circuits finishes performing the first set of operations to reduce the power supply voltage droop, and wherein the delay is programmable.

In Example 4, the circuit system of any one of Examples 1-3 may optionally further include, wherein the first integrated circuit die further comprises a third group of circuits configured to perform a third set of operations with a delay after the first group of circuits starts performing the first set of operations, wherein the second integrated circuit die further comprises a fourth group of circuits configured to perform a fourth set of operations with a delay after the second group of circuits starts performing the second set of operations, and wherein the second group of circuits is configured to start performing the second set of operations with a delay after the third group of circuits starts performing the third set of operations.

In Example 5, the circuit system of Example 4 may optionally further include, wherein the third group of circuits is configured to start performing the third set of operations before the first group of circuits finishes performing the first set of operations, and wherein the fourth group of circuits is configured to start performing the fourth set of operations before the second group of circuits finishes performing the second set of operations.

In Example 6, the circuit system of Example 4 may optionally further include, wherein the third group of circuits is configured to start performing the third set of operations after the first group of circuits finishes performing the first set of operations, and wherein the fourth group of circuits is configured to start performing the fourth set of operations after the second group of circuits finishes performing the second set of operations.

In Example 7, the circuit system of Example 4 may optionally further include, wherein the first and second sets of operations are part of a first operation thread, wherein the third and fourth sets of operations are part of a second operation thread, wherein the first, second, third and fourth groups of circuits have an identical circuit structure, and wherein the circuit system is a three dimensional circuit system comprising a third integrated circuit die that is vertically stacked with and coupled to the first and the second integrated circuit dies.

In Example 8, the circuit system of any one of Examples 1-7 may optionally further comprise: a third integrated circuit die comprising a third group of circuits configured to start performing a third set of operations with a delay after the second group of circuits starts performing the second set of operations to reduce the power supply voltage droop, wherein the first, second, and third groups of circuits have an identical circuit structure.

In Example 9, the circuit system of Example 8 may optionally further include, wherein the third group of circuits is configured to start performing the third set of operations before the second group of circuits finishes performing the second set of operations to reduce the power supply voltage droop.

In Example 10, the circuit system of Example 8 may optionally further include, wherein the third group of circuits is configured to start performing the third set of operations after the second group of circuits finishes performing the second set of operations to reduce the power supply voltage droop.

Example 11 is a method of operating a circuit system to reduce voltage droop in a supply voltage, the method comprising: performing a first set of operations using a first group of circuits in a first integrated circuit die; and performing a second set of operations using a second group of circuits in a second integrated circuit die with a delay after the first group of circuits starts performing the first set of operations.

In Example 12, the method of Example 11 may optionally further include, wherein performing the second set of operations using the second group of circuits further comprises starting to perform the second set of operations before the first group of circuits finishes performing the first set of operations to reduce the voltage droop, and wherein the delay is programmable.

In Example 13, the method of Example 11 may optionally further include, wherein performing the second set of operations using the second group of circuits further comprises starting to perform the second set of operations after the first group of circuits finishes performing the first set of operations to reduce the voltage droop, and wherein the delay is programmable.

In Example 14, the method of any one of Examples 11-13 may optionally further comprise: performing a third set of operations using a third group of circuits in the first integrated circuit die with a delay after the first group of circuits starts performing the first set of operations; and performing a fourth set of operations using a fourth group of circuits in the second integrated circuit die with a delay after the second group of circuits starts performing the second set of operations, wherein performing the second set of operations using the second group of circuits further comprises performing the second set of operations with a delay after the third group of circuits starts performing the third set of operations.

In Example 15, the method of Example 14 may optionally further comprise: partitioning logic circuits into the first, the second, the third, and the fourth groups of circuits based on predicted switching activity of the logic circuits.

In Example 16, the method of any one of Examples 11-15 may optionally further comprise: performing a third set of operations using a third group of circuits in a third integrated circuit die with a delay after the second group of circuits starts performing the second set of operations to reduce the voltage droop, wherein the first, second, and third groups of circuits have an identical circuit structure.

In Example 17, the method of any one of Examples 11-16 may optionally further comprise: partitioning logic circuits into the first and the second groups of circuits based on predicted switching activity of the logic circuits.

Example 18 is a circuit system comprising: a first integrated circuit die comprising a first state machine circuit; a second integrated circuit die comprising a second state machine circuit and a first decoupling capacitor; and a third integrated circuit die comprising a third state machine circuit and a second decoupling capacitor, wherein the first state machine circuit instructs the second and third state machine circuits to cause the first decoupling capacitor to be coupled to the second decoupling capacitor to reduce voltage droop in a supply voltage in the second integrated circuit die during a high current event in the second integrated circuit die.

In Example 19, the circuit system of Example 18 may optionally further comprise: a fourth integrated circuit die comprising a fourth state machine circuit and a third decoupling capacitor, wherein the first state machine circuit instructs the second, third, and fourth state machine circuits to cause the first, second, and third decoupling capacitors to be coupled together to reduce the voltage droop during the high current event.

In Example 20, the circuit system of any one of Examples 18-19 may optionally further include, wherein the second integrated circuit die further comprises a first switching circuit, wherein the third integrated circuit die further comprises a second switching circuit, wherein the second state machine circuit is configured to cause the first switching circuit to couple the first decoupling capacitor to the second decoupling capacitor, and wherein the third state machine circuit is configured to cause the second switching circuit to couple the second decoupling capacitor to the first decoupling capacitor.

In Example 21, the circuit system of any one of Examples 18-20 may optionally further include, wherein the first integrated circuit die is a programmable logic integrated circuit, and wherein the first state machine circuit dynamically reallocates configuration data for configuring logic circuits in the first integrated circuit die between the second and third integrated circuit dies in order to shorten a duration of the high current event.

In Example 22, the circuit system of Example 21 may optionally further include, wherein the first state machine circuit dynamically changes a number of the logic circuits performing an operation thread by reallocating the configuration data between the second integrated circuit die and the third integrated circuit die.

The foregoing description of the exemplary embodiments has been presented for the purpose of illustration. The foregoing description is not intended to be exhaustive or to be limiting to the examples disclosed herein. In some instances, various features can be employed without a corresponding use of other features as set forth. Many modifications, substitutions, and variations are possible in light of the above teachings, without departing from the scope of the present embodiments.

What is claimed is:

1. A circuit system comprising:
a first integrated circuit die comprising a first group of circuits configured to perform a first set of operations; and
a second integrated circuit die comprising a second group of circuits configured to start performing a second set of operations with a first delay after the first group of circuits starts performing the first set of operations to reduce power supply voltage droop, wherein logic circuits are partitioned into the first and the second groups of circuits based on predicted switching activity of the logic circuits.

2. The circuit system of claim 1, wherein the second group of circuits is configured to start performing the second set of operations before the first group of circuits finishes performing the first set of operations to reduce the power supply voltage droop, and wherein the first delay is programmable.

3. The circuit system of claim 1, wherein the second group of circuits is configured to start performing the second set of operations after the first group of circuits finishes performing the first set of operations to reduce the power supply voltage droop, and wherein the first delay is programmable.

4. The circuit system of claim 1, wherein the first integrated circuit die further comprises a third group of circuits configured to perform a third set of operations with a second delay after the first group of circuits starts performing the first set of operations, wherein the second integrated circuit die further comprises a fourth group of circuits configured to perform a fourth set of operations with a third delay after the second group of circuits starts performing the second set of operations, and wherein the second group of circuits is configured to start performing the second set of operations with a fourth delay after the third group of circuits starts performing the third set of operations.

5. The circuit system of claim 4, wherein the third group of circuits is configured to start performing the third set of operations before the first group of circuits finishes performing the first set of operations, and wherein the fourth group of circuits is configured to start performing the fourth set of operations before the second group of circuits finishes performing the second set of operations.

6. The circuit system of claim 4, wherein the third group of circuits is configured to start performing the third set of operations after the first group of circuits finishes performing the first set of operations, and wherein the fourth group of circuits is configured to start performing the fourth set of operations after the second group of circuits finishes performing the second set of operations.

7. The circuit system of claim 4, wherein the first and the second sets of operations are part of a first operation thread, wherein the third and the fourth sets of operations are part of a second operation thread, and wherein the circuit system is a three dimensional circuit system comprising a third integrated circuit die that is vertically stacked with and coupled to the first and the second integrated circuit dies.

8. The circuit system of claim 1 further comprising:
a third integrated circuit die comprising a third group of circuits configured to start performing a third set of operations with a second delay after the second group of circuits starts performing the second set of operations to reduce the power supply voltage droop, wherein the first, the second, and the third groups of circuits have an identical circuit structure.

9. The circuit system of claim 8, wherein the third group of circuits is configured to start performing the third set of operations before the second group of circuits finishes performing the second set of operations to reduce the power supply voltage droop.

10. The circuit system of claim 8, wherein the third group of circuits is configured to start performing the third set of operations after the second group of circuits finishes performing the second set of operations to reduce the power supply voltage droop.

11. A method of operating a circuit system to reduce voltage droop in a supply voltage, the method comprising:
performing a first set of operations using a first group of circuits in a first integrated circuit die;
performing a second set of operations using a second group of circuits in a second integrated circuit die with a first delay after the first group of circuits starts performing the first set of operations; and
partitioning logic circuits into the first and the second groups of circuits based on predicted switching activity of the logic circuits.

12. The method of claim 11, wherein performing the second set of operations using the second group of circuits further comprises starting to perform the second set of operations before the first group of circuits finishes performing the first set of operations to reduce the voltage droop, and wherein the first delay is programmable.

13. The method of claim 11, wherein performing the second set of operations using the second group of circuits further comprises starting to perform the second set of operations after the first group of circuits finishes performing the first set of operations to reduce the voltage droop, and wherein the first delay is programmable.

14. The method of claim 11 further comprising:
performing a third set of operations using a third group of circuits in the first integrated circuit die with a second delay after the first group of circuits starts performing the first set of operations; and
performing a fourth set of operations using a fourth group of circuits in the second integrated circuit die with a third delay after the second group of circuits starts performing the second set of operations,
wherein performing the second set of operations using the second group of circuits further comprises performing the second set of operations with a fourth delay after the third group of circuits starts performing the third set of operations.

15. The method of claim 14 further comprising:
partitioning the logic circuits into the first, the second, the third, and the fourth groups of circuits based on the predicted switching activity of the logic circuits.

16. The method of claim 11 further comprising:
performing a third set of operations using a third group of circuits in a third integrated circuit die with a second delay after the second group of circuits starts performing the second set of operations to reduce the voltage droop, wherein the first, the second, and the third groups of circuits have an identical circuit structure.

17. The method of claim 11,
wherein the first and the second sets of operations are part of an operation thread.

18. A circuit system comprising:
a first integrated circuit die comprising a first state machine circuit;
a second integrated circuit die comprising a second state machine circuit and a first decoupling capacitor; and
a third integrated circuit die comprising a third state machine circuit and a second decoupling capacitor, wherein the first state machine circuit instructs the second and the third state machine circuits to cause the first decoupling capacitor to be coupled to the second decoupling capacitor to reduce voltage droop in a supply voltage in the second integrated circuit die during a high current event in the second integrated circuit die.

19. The circuit system of claim 18 further comprising:
a fourth integrated circuit die comprising a fourth state machine circuit and a third decoupling capacitor, wherein the first state machine circuit instructs the second, the third, and the fourth state machine circuits to cause the first, the second, and the third decoupling capacitors to be coupled together to reduce the voltage droop during the high current event.

20. The circuit system of claim 18, wherein the second integrated circuit die further comprises a first switching circuit, wherein the third integrated circuit die further comprises a second switching circuit, wherein the second state machine circuit is configured to cause the first switching circuit to couple the first decoupling capacitor to the second decoupling capacitor, and wherein the third state machine circuit is configured to cause the second switching circuit to couple the second decoupling capacitor to the first decoupling capacitor.

21. The circuit system of claim 18, wherein the first integrated circuit die is a programmable logic integrated circuit, and wherein the first state machine circuit dynamically reallocates configuration data for configuring logic circuits in the first integrated circuit die between the second and the third integrated circuit dies in order to shorten a duration of the high current event.

22. The circuit system of claim 21, wherein the first state machine circuit dynamically changes a number of the logic circuits performing an operation thread by reallocating the configuration data between the second integrated circuit die and the third integrated circuit die.

* * * * *